(12) United States Patent
Kawaguchi et al.

(10) Patent No.: US 12,230,540 B2
(45) Date of Patent: Feb. 18, 2025

(54) SUBSTRATE PROCESSING SYSTEM AND SUBSTRATE PROCESSING METHOD

(71) Applicant: Tokyo Electron Limited, Tokyo (JP)

(72) Inventors: Yoshihiro Kawaguchi, Koshi (JP); Hirotoshi Mori, Koshi (JP); Kazuya Hisano, Koshi (JP)

(73) Assignee: Tokyo Electron Limited, Tokyo (JP)

( * ) Notice: Subject to any disclaimer, the term of this patent is extended or adjusted under 35 U.S.C. 154(b) by 1151 days.

(21) Appl. No.: 17/050,490

(22) PCT Filed: Apr. 16, 2019

(86) PCT No.: PCT/JP2019/016370
§ 371 (c)(1),
(2) Date: Oct. 26, 2020

(87) PCT Pub. No.: WO2019/208338
PCT Pub. Date: Oct. 31, 2019

(65) Prior Publication Data
US 2021/0242084 A1    Aug. 5, 2021

(30) Foreign Application Priority Data
Apr. 27, 2018  (JP) ................ 2018-086913

(51) Int. Cl.
*H01L 21/78* (2006.01)
*B23K 26/00* (2014.01)
(Continued)

(52) U.S. Cl.
CPC .......... *H01L 21/78* (2013.01); *B23K 26/0006* (2013.01); *H01L 21/263* (2013.01);
(Continued)

(58) Field of Classification Search
CPC ..... H01L 21/78; H01L 21/263; H01L 21/304; H01L 21/67092; H01L 21/67115;
(Continued)

(56) References Cited

U.S. PATENT DOCUMENTS 10,695,862 B2 * 6/2020 Nomura ................ B23K 26/04
2008/0056857 A1 * 3/2008 Hiroki .................... H01L 21/681
211/41.18

(Continued)

FOREIGN PATENT DOCUMENTS

| CN | 102280400 A | 12/2011 |
| JP | 2002-217268 A | 8/2002 |
| JP | 2003163184 A | 6/2003 |

OTHER PUBLICATIONS

International Search Report of PCT/JP2019/016370 dated May 28, 2019.

*Primary Examiner* — Alex B Efta
*Assistant Examiner* — Alexander S Wright
(74) *Attorney, Agent, or Firm* — Shih IP Law Group, PLLC.

(57) ABSTRACT

A substrate processing system includes a pre-alignment apparatus having a pre-alignment stage configured to hold a processing target substrate and a detector configured to detect a center position and a crystal orientation of the processing target substrate held by the pre-alignment stage; and a laser processing apparatus having a laser processing stage configured to hold the processing target substrate and a laser processing head configured to radiate and concentrate a laser beam for processing the processing target substrate to the processing target substrate held by the laser processing stage. The pre-alignment apparatus is disposed above the laser processing apparatus.

15 Claims, 8 Drawing Sheets

(51) Int. Cl.

| | |
|---|---|
| *B23K 103/00* | (2006.01) |
| *H01L 21/263* | (2006.01) |
| *H01L 21/304* | (2006.01) |
| *H01L 21/67* | (2006.01) |
| *H01L 21/677* | (2006.01) |
| *H01L 21/687* | (2006.01) |

(52) U.S. Cl.
CPC ...... *H01L 21/304* (2013.01); *H01L 21/67092* (2013.01); *H01L 21/67115* (2013.01); *H01L 21/67259* (2013.01); *H01L 21/67766* (2013.01); *H01L 21/67778* (2013.01); *H01L 21/68707* (2013.01); *H01L 21/68764* (2013.01); *B23K 2103/56* (2018.08)

(58) Field of Classification Search
CPC ......... H01L 21/67259; H01L 21/67766; H01L 21/67778; H01L 21/68707; H01L 21/68764; H01L 21/681; H01L 21/6715; H01L 21/67775; H01L 21/68; B23K 26/0006; B23K 26/20; B23K 26/36; B23K 26/60; B23K 26/02; B23K 26/03; B23K 2103/56; B23K 37/0461; B24B 7/04

See application file for complete search history.

(56) References Cited

U.S. PATENT DOCUMENTS

| | | | |
|---|---|---|---|
| 2012/0160397 A1* | 6/2012 | Yamamoto | H01L 21/67092 156/154 |
| 2017/0207108 A1* | 7/2017 | Choi | B24B 7/228 |

* cited by examiner

SUBSTRATE PROCESSING SYSTEM AND SUBSTRATE PROCESSING METHOD

TECHNICAL FIELD

The various aspects and embodiments described herein pertain generally to a substrate processing system and a substrate processing method.

BACKGROUND

A cutting apparatus of Patent Document 1 includes a cassette placing device configured to place a cassette accommodating therein a semiconductor wafer; a position aligning device configured to align a center position and a crystal orientation of the semiconductor wafer carried out of the cassette; and a cutting device configured to cut the semiconductor wafer carried out of the position aligning device.

PRIOR ART DOCUMENT

Patent Document 1: Japanese Patent Laid-open Publication No. 2003-163184

DISCLOSURE OF THE INVENTION

Problems to be Solved by the Invention

Means for Solving the Problems

In an exemplary embodiment, a substrate processing system includes a pre-alignment apparatus comprising a pre-alignment stage configured to hold a processing target substrate and a detector configured to detect a center position and a crystal orientation of the processing target substrate held by the pre-alignment stage; and a laser processing apparatus comprising a laser processing stage configured to hold the processing target substrate and a laser processing head configured to radiate and concentrate a laser beam for processing the processing target substrate to the processing target substrate held by the laser processing stage. The pre-alignment apparatus is disposed above the laser processing apparatus.

BRIEF DESCRIPTION OF THE DRAWINGS

In the detailed description that follows, embodiments are described as illustrations only since various changes and modifications will become apparent to those skilled in the art from the following detailed description. The use of the same reference numbers in different figures indicates similar or identical items.

DETAILED DESCRIPTION

Figure 1:
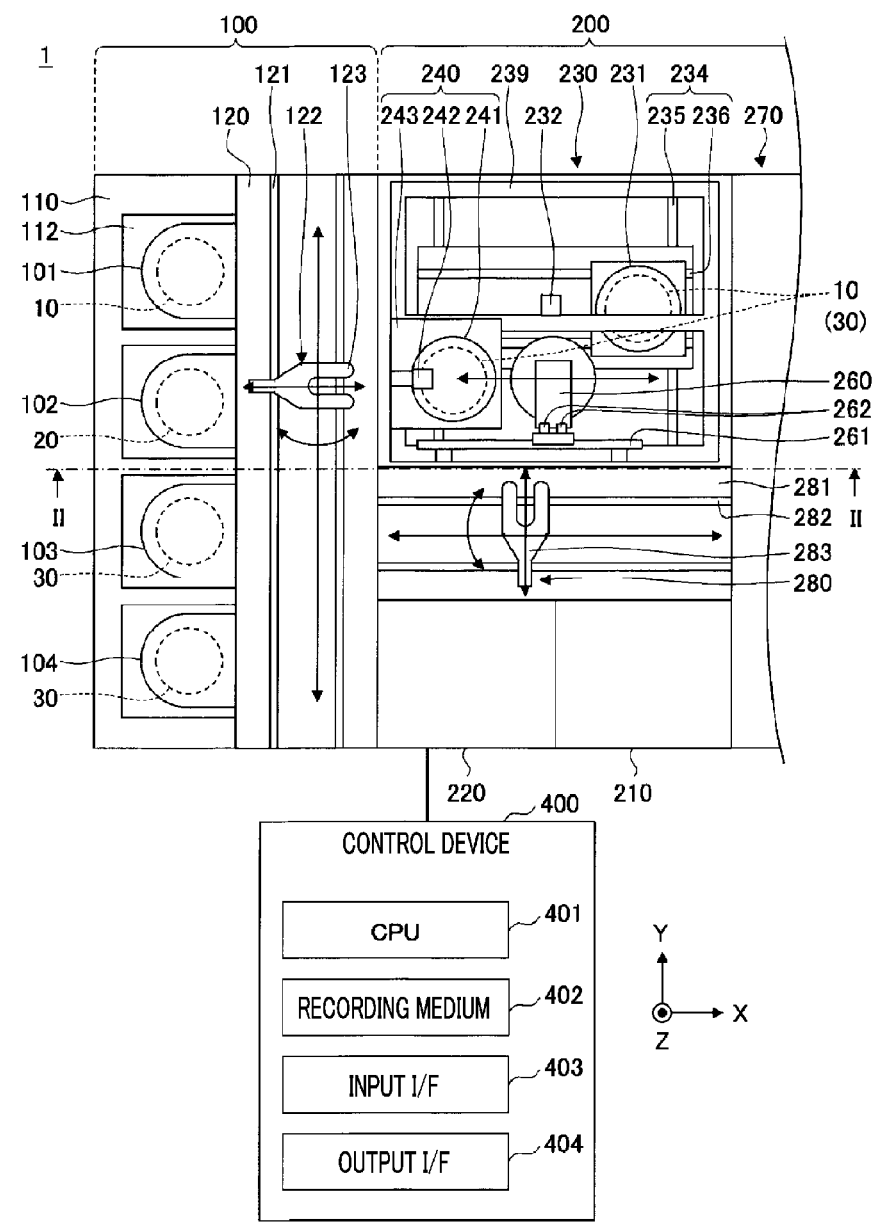
FIG. 1 is a plan view illustrating a substrate processing system according to an exemplary embodiment.

Hereinafter, exemplary embodiments of the present disclosure will be described with reference to the accompanying drawings. In the various drawings, same or corresponding parts will be assigned same or corresponding reference numerals, and redundant description will be omitted.

Figure 2:
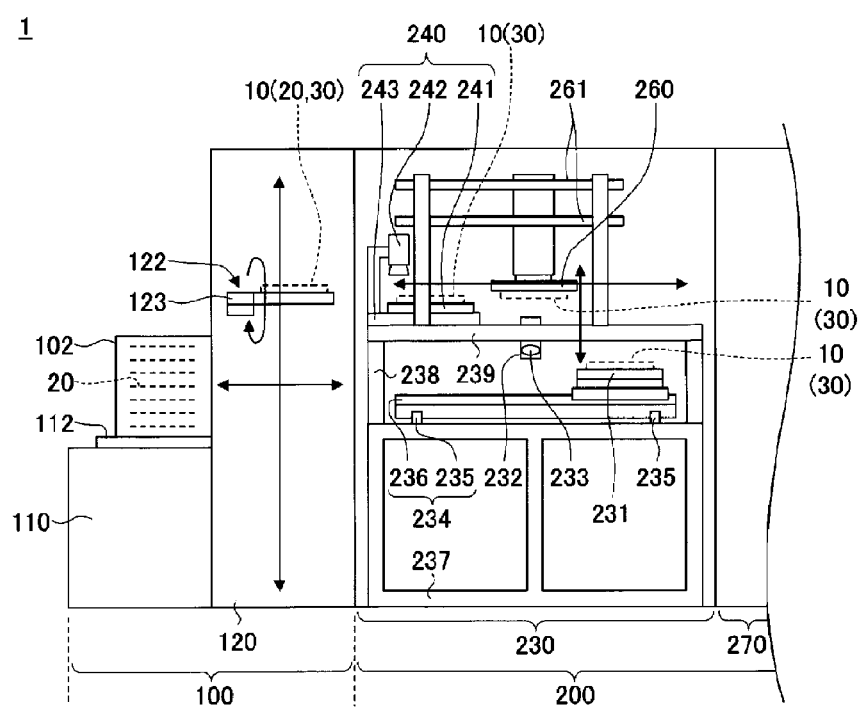
FIG. 2 is a cross sectional view illustrating the substrate processing system according to the exemplary embodiment, taken along a line II-II of FIG. 1.

FIG. 1 is a plan view illustrating a substrate processing system according to an exemplary embodiment. FIG. 2 is a cross sectional view illustrating the substrate processing system according to the exemplary embodiment, taken along a line II-II of FIG. 1. In FIG. 1 and FIG. 2, the X-axis direction, the Y-axis direction and the Z-axis direction are orthogonal to each other, and the X-axis and Y-axis directions are horizontal directions whereas the Z-axis direction is a vertical direction. A rotational direction around a vertical axis is also referred to as "θ direction." In the present specification, below means vertically below, and above means vertically above.

A substrate processing system 1 is configured to perform a laser processing of a processing target substrate 10. Further, the substrate processing system 1 is also configured to perform thinning of the processing target substrate 10. Either of the laser processing of the processing target substrate 10 and the thinning of the processing target substrate 10 may be performed first. The substrate processing system 1 is configured to be capable of coping with any of two cases where the laser processing of the processing target substrate 10 is performed first and where the thinning processing of the processing target substrate 10 is performed first. Further, the substrate processing system 1 may be configured to perform only the laser processing of the processing target substrate 10 between the laser processing and the thinning of the processing target substrate 10.

In order to reinforce the processing target substrate 10 before the laser processing and the thinning of the processing target substrate 10, the substrate processing system 1 prepares a combined substrate 30 (see FIG. 6) by bonding the processing target substrate 10 and a support substrate 20. A bonding surface of the processing target substrate 10 to be bonded to the support substrate 20 is a first main surface 11, and no protective tape is attached to this first main surface 11. Further, the processing target substrate 10 may not be bonded with the support substrate 20, and in such a case, a protective tape is attached to the first main surface 11 of the processing target substrate 10.

The substrate processing system 1 includes a carry-in/out station 100 in which a cassette 101 accommodating therein the processing target substrate 10 is carried in/out. Besides the cassette 101 accommodating the processing target substrate 10 therein, a cassette 102 accommodating therein the support substrate 20 and cassettes 103 and 104 accommodating therein the combined substrate 30 are also carried into or out of the carry-in/out station 100.

The carry-in/out station 100 is equipped with a cassette table 110 on which the cassette 101 accommodating therein the processing target substrate 10 is placed. The cassette table 110 includes a plurality of (e.g., four) placing plates 112. These placing plates 112 are arranged at a regular distance therebetween in the Y-axis direction. The cassettes 101, 102, 103 and 104 are respectively placed on the placing plates 112. The combined substrate 30 is sorted into a proper substrate or a faulty substrate, and the proper substrate is accommodated in the cassette 103 for the proper one whereas the faulty substrate is accommodated in the cassette 104 for the faulty one.

Figure 3:
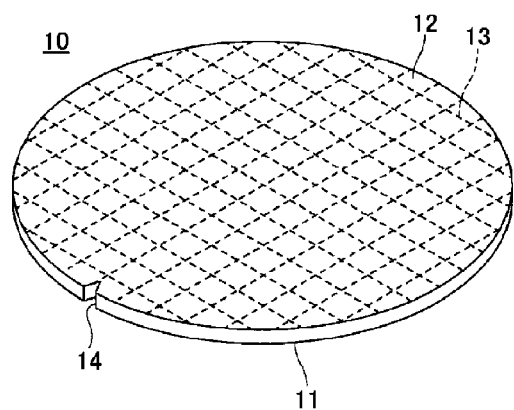
FIG. 3 is a perspective view illustrating a processing target substrate according to the exemplary embodiment.

FIG. 3 is a perspective view illustrating the processing target substrate according to the exemplary embodiment. The processing target substrate 10 is, for example, a semiconductor substrate such as a silicon wafer. The processing target substrate 10 has the first main surface 11 and a second main surface 12 which are mutually opposite to each other.

The first main surface 11 of the processing target substrate 10 is partitioned into multiple regions by a multiple number of streets formed to have a lattice pattern. A device such as an element, a circuit or a terminal is formed in each of the multiple regions. A dividing line 13 is set for each of the multiple number of streets. The processing target substrate 10 is split along the dividing lines 13, so that a multiple number of chips 19 (see FIG. 8) are obtained.

The processing target substrate 10 is accommodated in the cassette 101 with the first main surface 11 having the device formed thereon facing upwards. Further, after the processing target substrate 10 is taken out of the cassette 101, it is carried to the processing station 200 after being inverted upside down.

The carry-in/out station 100 (see FIG. 1 and FIG. 2) has a transfer section 120 in which the processing target substrate 10 is carried. The transfer section 120 is provided at the positive X-axis side of the cassette table 110. A guide rail 121 extending in the Y-axis direction is provided in the transfer section 120, and a transfer device 122 is moved along the guide rail 121.

The transfer device 122 is equipped with a first holding mechanism 123 as a holder configured to hold the processing target substrates 10. In the present exemplary embodiment, since the processing target substrate 10 is bonded to the support substrate 20, the transfer device 22 has a circular attraction surface having a diameter larger than a diameter of the processing target substrate 10, and the transfer device 22 does not have, on this attraction surface, a second holding mechanism configured to attract the processing target substrate 10. Further, the processing target substrate 10 may not be bonded with the support substrate 20, and in such a case, the transfer device 122 may have the second holding mechanism.

The first holding mechanism 123 is configured to be movable in the X-axis direction, the Z-axis direction and the 0 direction as well as in the Y-axis direction. The first holding mechanism 123 takes out the processing target substrate 10 from the cassette 101 placed on the cassette table 110. Further, the first holding mechanism 123 takes out the support substrate 20 from the cassette 102 placed on the cassette table 110. Further, the first holding mechanism 123 accommodates the combined substrate 30 in either the cassette 103 for proper substrate or the cassette 104 for faulty substrate placed on the cassette table 110.

The first holding mechanism 123 is formed to have a bifurcated shape to be easily inserted into the cassettes 101, 102, 103 and 104. The first holding mechanism 123 is configured to be inverted upside down to invert the processing target substrate 10 upside down.

The substrate processing system 1 is equipped with a processing station 200 configured to perform a processing on the processing target substrate 10 taken out from the cassette 101. The processing station 200 includes a coating apparatus 210 configured to coat an adhesive 22 on a bonding surface 21 of the support substrate 20 to be bonded to the processing target substrate 10; and a bonding apparatus 220 configured to bond the support substrate 20 and the processing target substrate 10 with the adhesive 22 therebetween. Here, the coating apparatus 210 and the bonding apparatus 220 are just examples, and the processing station 200 may not have the coating apparatus 210 and the bonding apparatus 220.

Figure 4:
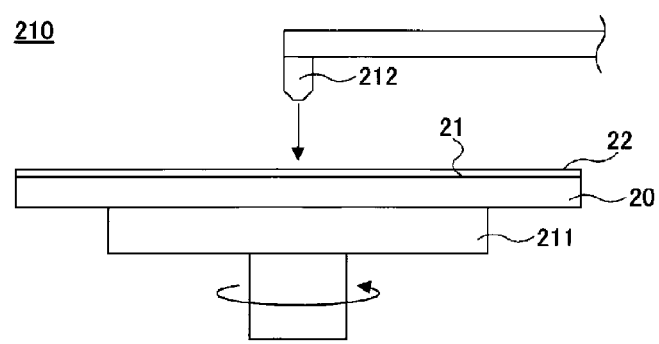
FIG. 4 is a diagram illustrating a coating apparatus according to the exemplary embodiment.

FIG. 4 is a diagram illustrating the coating apparatus according to the exemplary embodiment. The coating apparatus 210 is equipped with, for example, a spin chuck 211 configured to hold the support substrate 20 horizontally with the bonding surface 21 thereof facing upwards; and a coating nozzle 212 configured to coat the adhesive 22 onto the bonding surface 21 of the support substrate 20 held by the spin chuck 211.

The coating apparatus 210 coats the adhesive 22 on the bonding surface 21 of the support substrate 20 by rotating the spin chuck 211. Then, the coating apparatus 210 dries the adhesive 22. A glass substrate may be used as the support substrate 20. Alternatively, a semiconductor substrate may be used instead of this glass substrate. As the adhesive 22, a thermoplastic resin may be used, for example.

Figure 5:
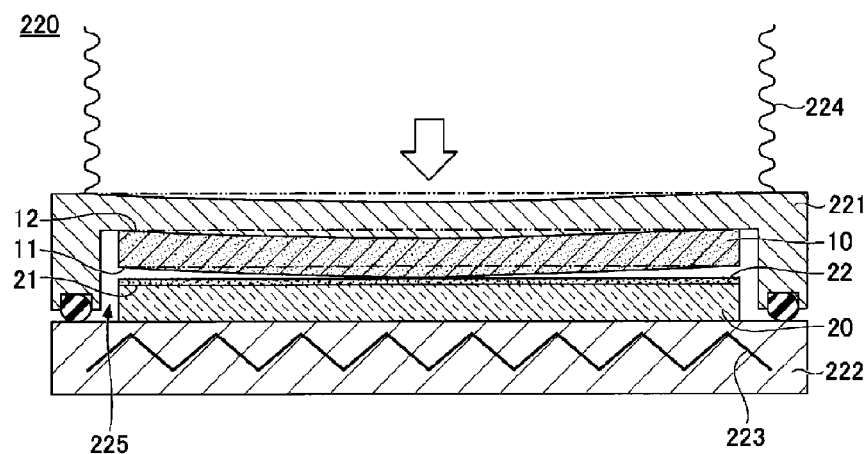
FIG. 5 is a diagram illustrating states before and after compressed air is supplied into a pressure vessel of a bonding apparatus according to the exemplary embodiment.
Figure 6:
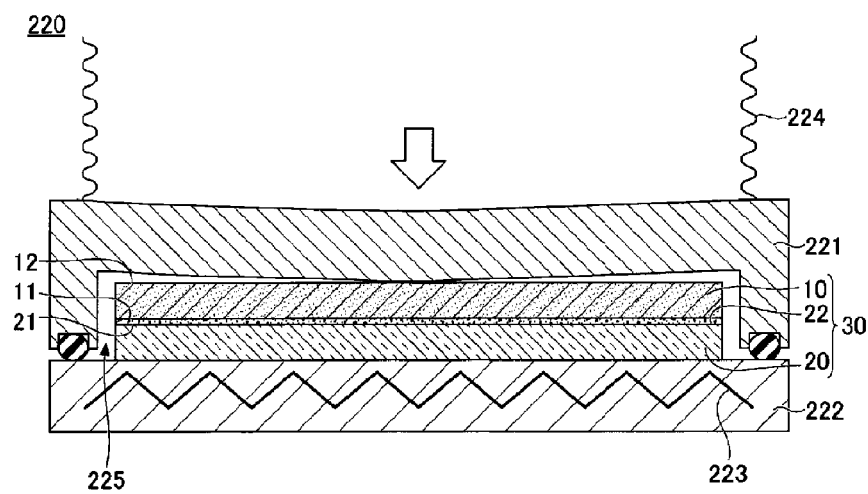
FIG. 6 is a diagram illustrating an example of a state in which a sealed space of the bonding apparatus indicated by a solid line in FIG. 5 is decompressed.

FIG. 5 is a diagram illustrating states before and after compressed air is supplied into a pressure vessel of the bonding apparatus according to the exemplary embodiment. A dashed double dotted line in FIG. 5 shows the state before the compressed air is supplied into a pressure vessel 224, and a solid line shows the state after the compressed air is supplied into the pressure vessel 224. FIG. 6 is a diagram illustrating an example of a state in which a sealed space of the bonding apparatus shown by the solid line of FIG. 5 is decompressed.

The bonding apparatus 220 is equipped with, for example, an upper chuck 221 configured to hold the processing target substrate 10 horizontally and a lower chuck 222 configured to hold the support substrate 20 horizontally. The lower chuck 222 has therein a heater 223 configured to heat the support substrate 20 to thereby heat the adhesive 22. The bonding apparatus 220 is equipped with the pressure vessel 224 into which the compressed air is supplied to transform an attraction surface of the upper chuck 221 for attracting the processing target substrate 10 to be convex curved downwards. The pressure vessel 224 is expandable and contractible in a vertical direction, and is made of, by way of non-limiting example, a metal bellows.

First, the bonding apparatus 220 lowers the upper chuck 221 to bring it into contact with the lower chuck 222, so that a sealed space 225 is formed between the upper chuck 221 and the lower chuck 222, as depicted in FIG. 5. Then, the bonding apparatus 220 supplies the compressed air into the pressure vessel 224, thus allowing the attraction surface of the upper chuck 221 for attracting the processing target substrate 10 to be convex curved downwards. As a result, a central portion of the processing target substrate 10 and a central portion of the support substrate 20 are bonded with the adhesive 22 therebetween.

Next, the bonding apparatus 220 decompresses the sealed space 225 to suppress entrainment of air. Since a pressure difference between the sealed space 225 and a suction hole of the upper chuck 221 is reduced, the upper chuck 221 is not be able to vacuum-attract the processing target substrate 10. Accordingly, the processing target substrate 10 is returned into a flat state as shown in FIG. 6 from the state in which it is convex curved downwards as shown in FIG. 5. At this time, the processing target substrate 10 and the support substrate 20 are gradually bonded from the central portion of the processing target substrate 10 toward a peripheral portion thereof.

Further, the coating apparatus 210 may coat the adhesive 22 on a bonding surface of the processing target substrate 10 to be bonded to the support substrate 20. The bonding surface of the processing target substrate 10 to be bonded to the support substrate 20 is the first main surface 11 having the device previously formed thereon.

Figure 7:
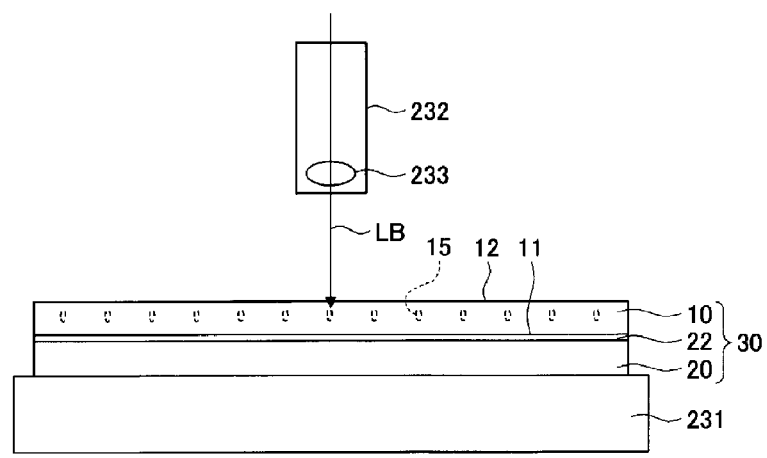
FIG. 7 is a diagram illustrating a laser processing apparatus according to the exemplary embodiment.

The processing station 200 is equipped with a laser processing apparatus 230 configured to perform a laser processing of the processing target substrate 10. FIG. 7 is a diagram illustrating major parts of the laser processing apparatus according to the exemplary embodiment. By way of example, the laser processing apparatus 230 is configured to perform a laser processing (so-called laser dicing) for splitting the processing target substrate 10 into the multiple number of chips 19 (see FIG. 8).

The laser processing apparatus 230 is equipped with a laser processing stage 231 configured to hold the processing target substrate 10 thereon; and a laser processing head 232 configured to radiate and concentrate a laser beam LB for processing the processing target substrate 10 to the processing target substrate 10 held on the laser processing stage 231.

The laser processing stage 231 supports the processing target substrate 10 from below it so that the second main surface 12 of the processing target substrate 10 faces upwards. The laser processing stage 231 has a circular attraction surface having a diameter larger than that of the processing target substrate 10, and attracts the processing target substrate 10 onto this attraction surface 10. The laser processing stage 231 may be a vacuum chuck configured to vacuum-attract the processing target substrate 10, or an electrostatic chuck configured to attract the processing target substrate 10 electrostatically. The laser processing stage 231 holds thereon the processing target substrate 10 bonded to the support substrate 20 previously, that is, the combined substrate 30.

The laser processing head 232 has a condensing lens 233 disposed vertically above the laser processing stage 231. The condensing lens 233 is configured to concentrate the laser beam LB to an inside of the processing target substrate 10, thus allowing a modification layer 15 serving as a split starting point to be formed within the processing target substrate 10. When forming the modification layer 15 within the processing target substrate 10, the laser beam transmissive to the processing target substrate 10 is used. For example, the modification layer 15 is formed by locally melting and solidifying the inside of the processing target substrate 10.

In the present exemplary embodiment, the laser beam LB forms the modification layer 15 serving as the split starting point within the processing target substrate 10. However, the laser beam LB may form a laser processing groove on a top surface of the processing target substrate 10. The laser processing groove may or may not be formed through the processing target substrate 10 in a plate thickness direction. When forming the laser processing groove on the top surface of the processing target substrate 10, the laser beam having absorptivity for the processing target substrate 10 is used.

The laser processing apparatus 230 is equipped with a moving mechanism 234 (see FIG. 1 and FIG. 2) configured to move the laser processing stage 231 to move an irradiation point of the laser beam LB on the top surface of the processing target substrate 10. The moving mechanism 234 is configured to move the laser moving stage 231 in the X-axis direction, the Y-axis direction and the θ direction.

The moving mechanism 234 is implemented by, for example, an XYθ stage, and includes a Y-axis guide 235, a Y-axis slider configured to be moved along the Y-axis guide 235, an X-axis guide 236, an X-axis slider configured to be moved along the X-axis guide 236, a rotation shaft parallel to the Z-axis, and a rotary table configured to be rotated around the rotation shaft. The Y-axis guide 235 is fixed to, for example, a base frame 237. The X-axis guide 236 is fixed to the Y-axis slider which is configured to be moved along the Y-axis guide. The rotary table is rotatably fixed to the X-axis slider which is configured to be moved along the X-axis guide 236. The laser processing stage 231 is fixed to the rotary table.

Though the moving mechanism 234 is implemented by the XYθ stage in the present exemplary embodiment, it may be a XYZθ stage. That is, the laser processing stage 231 may be configured to be moved in the Z-axis direction as well.

The laser processing apparatus 230 is equipped with the base frame 237, a multiple number of supporting columns 238 mounted to the base frame 237 in a standing posture, and a ceiling frame 239 supported by the multiple number of supporting columns 238. The moving mechanism 234 is fixed to the base frame 237, and the laser processing head 232 is mounted to the ceiling frame 239.

The processing station 200 includes a pre-alignment apparatus 240. The pre-alignment apparatus 240 includes a pre-alignment stage 241 configured to hold the processing target substrate 10, and a detector 242 configured to detect a center position and a crystal orientation of the processing target substrate 10 held by the pre-alignment stage 241. The detector 242 detects the crystal orientation of the processing target substrate 10 by detecting a position of a notch 14 (see FIG. 3) which indicates the crystal orientation of the processing target substrate 10. The detector 242 may detect a position of an orientation flat instead of detecting the position of the notch 14.

The pre-alignment stage 241 supports the processing target substrate 10 from below it so that the second main surface 12 of the processing target substrate 10 faces upwards. The pre-alignment stage 241 has a circular attraction surface having a diameter larger than that of the processing target substrate 10 and attracts the processing target substrate 10 onto this attraction surface. Though the pre-alignment stage 241 is a vacuum chuck configured to vacuum-attract the processing target substrate 10 in the present exemplary embodiment, it may be an electrostatic chuck configured to attract the processing target substrate 10 electrostatically. The pre-alignment stage 241 holds thereon the processing target substrate 10 bonded with the support substrate 20 previously, that is, the combined substrate 30.

The detector 242 includes, for example, an imaging device and is configured to image a periphery of the processing target substrate 10 held by the pre-alignment stage 241. The pre-alignment stage 241 is rotated around a vertical axis to image a multiple number of points of the periphery of the processing target substrates 10. The detector 242 sends a signal of an obtained image to a control device 400. The control device 400 obtains the center position and the crystal orientation of the processing target substrate 10 in a coordinate system fixed to the pre-alignment stage 241 by performing an image-processing on the image obtained by the detector 242.

The pre-alignment apparatus 240 has a mounting base 243 fixed to the ceiling frame 239 of the laser processing apparatus 230. The pre-alignment stage 241 is rotatably mounted to the mounting base 243. Further, a supporting column for supporting the detector 242 is fixed to the mounting base 243.

The pre-alignment apparatus 240 is disposed on top of the laser processing apparatus 230. Since the pre-alignment apparatus 240 and the laser processing apparatus 230 are stacked in a vertical direction, an installation area of the substrate processing system 1 can be reduced as compared to a case where the pre-alignment apparatus 240 and the laser processing apparatus 230 are arranged in a horizontal direction. When viewed from vertical direction, the pre-alignment apparatus 240 is placed inside an edge of the base frame 237 so as not to be protruded from the base frame 237 of the laser processing apparatus 230.

The processing station 200 is equipped with a transfer arm 260 configured to receive the processing target substrate 10 from the pre-alignment apparatus 240 and transfer the received processing target substrate 10 to the laser processing apparatus 230. The transfer arm 260 is configured to be moved in the X-axis direction along the X-axis guide 261 and in the Z-axis direction along the Z-axis guide 262. Further, though the transfer arm 260 is not movable in the Y-axis direction in the present exemplary embodiment, it may be configured to be movable in the Y-axis direction as well.

The transfer arm 260 holds the processing target substrate 10 from above it so that the first main surface 11 of the processing target substrate 10 faces downwards. The transfer arm 260 has a circular attraction surface having a diameter larger than that of the processing target substrate 10, and attracts the processing target substrate 10 onto this attraction surface. Though the transfer arm 260 is configured as a vacuum chuck which vacuum-attracts the processing target substrate 10, it may be an electrostatic chuck configured to attract the processing target substrate 10 electrostatically. The transfer arm 260 holds the processing target substrate 10 bonded with the support substrate 20 previously, that is, the combined substrate 30.

The transfer arm 260 transfers the processing target substrate 10 from the pre-alignment apparatus 240 to the laser processing apparatus 230, as stated above. The transfer arm 260 is used when the thinning of the processing target substrate 10 (see FIG. 10) is performed after the laser processing of the processing target substrate 10. In this case, as will be described later in detail, the transfer device 280 of the processing station 200 carries the combined substrate 30 into the pre-alignment apparatus 240, and the transfer arm 260 then carries out the combined substrate 30 from the pre-alignment apparatus 240.

Although the transfer device 280 of the processing station 200 may be used to carry out the combined substrate 30 from the pre-alignment apparatus 240, the transfer arm 260 is used in the present exemplary embodiment. According to the present exemplary embodiment, since a path through which the combined substrate 30 is carried into the pre-alignment apparatus 240 and a path through which the combined substrate 30 is carried out of the pre-alignment apparatus 240 are different from each other, stagnation in a flow of the combined substrate 30 can be suppressed.

Further, even in case that the processing target substrate 10 is not bonded with the support substrate 20 previously, the same effect can be achieved. In this case, the transfer device 122 of the carry-in/out station 100 carries the processing target substrate 10 into the pre-alignment apparatus 240, and the transfer arm 260 then carries out the processing target substrate 10 from the pre-alignment apparatus 240. Thus, since a path through which the processing target substrate 10 is carried into the pre-alignment apparatus 240 and a path through which the processing target substrate 10 is carried out of the pre-alignment apparatus 240 are different from each other, stagnation in a flow of the processing target substrate 10 can be suppressed.

Furthermore, the transfer arm 260 may also be used when the processing target substrate 10 is returned back to the carry-in/out station 100 without being subjected to the thinning processing of the processing target substrate 10 after the laser processing of the processing target substrate 10. In this case as well, the stagnation of the flow of the processing target substrate 10 can be suppressed since the transfer device 122 of the carry-in/out station 100 carries the processing target substrate 10 into the pre-alignment apparatus 240 and the transfer arm 260 then carries out the processing target substrate 10 from the pre-alignment apparatus 240.

The transfer arm 260 is configured to be movable vertically above the moving mechanism 234 which moves the laser processing stage 231. Since the transfer arm 260 and the moving mechanism 234 of the laser processing stage 231 are stacked in the vertical direction, the installation area of the substrate processing system 1 can be reduced as compared to a case where the transfer arm 260 and the moving mechanism 234 of the laser processing stage 231 are arranged in the horizontal direction. When viewed from the vertical direction, the transfer arm 260 is moved inside the edge of the base frame 237 so as not to be protruded from the base frame 237 of the laser processing apparatus 230.

Figure 8:
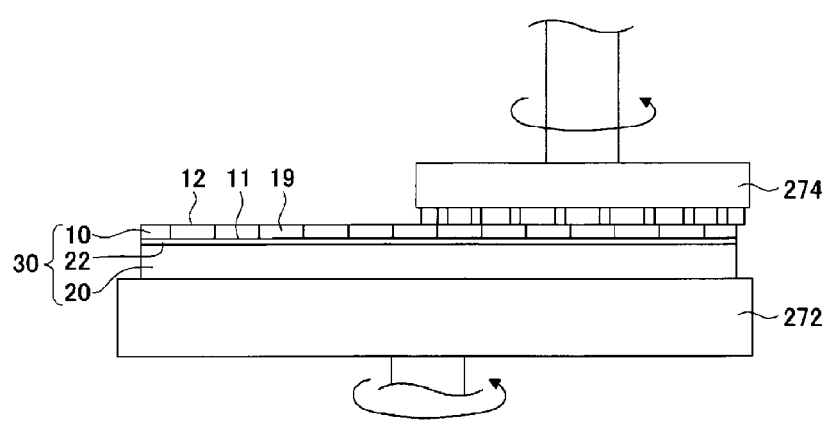
FIG. 8 is a diagram illustrating a thinning apparatus according to the exemplary embodiment.

The processing station 200 is equipped with a thinning apparatus 270 configured to perform the thinning of the processing target substrate 10. FIG. 8 is a diagram illustrating the thinning apparatus according to the exemplary embodiment. The thinning apparatus 270 is configured to thin the processing target substrate 10 by grinding the second main surface 12 of the processing target substrate 10.

The thinning apparatus 270 is equipped with a rotary chuck 272 configured to hold the processing target substrate 10 from below it so that the second main surface 12 of the processing target substrate 10 faces upwards. The rotary chuck 272 has a circular attraction surface having a diameter larger than that of the processing target substrate 10, and attracts the processing target substrate 10 onto this attraction surface. Though the rotary chuck 272 is, for example, a vacuum chuck configured to vacuum-attract the processing target substrate 10 in the present exemplary embodiment, it may be an electrostatic chuck configured to attract the processing target substrate 10 electrostatically.

The thinning apparatus 270 is equipped with a rotary whetstone 274 disposed vertically above the rotary chuck 272. The rotary whetstone 274 is lowered while being rotated and grinds the top surface (second main surface 12) of the processing target substrate 10 which is rotated along with the rotary chuck 272. When the thinning of the processing target substrate 10 is performed after the laser processing of the processing target substrate 10, a crack develops from the modification layer 15 shown in FIG. 7 in the plate thickness direction, so that the processing target substrate 10 is split into a multiple number of chips 19 (see FIG. 8). Further, the modification layer 15 shown in FIG. 7 is removed by the grinding.

The thinning apparatus 270 and the carry-in/out station 100 are disposed at opposite sides from each other with the laser processing apparatus 230 therebetween in the horizontal direction (see FIG. 1 and FIG. 2). The thinning apparatus 270 is disposed at a positive X-axis side of the laser processing apparatus 230, and the carry-in/out station 100 is disposed at a negative X-axis side of the laser processing apparatus 230. The laser processing apparatus 230 which does not produce a grinding residue is disposed between the carry-in/out station 100 and the thinning apparatus 270 which produces a grinding residue. With this configuration, the carry-in/out station 100 can be maintained clean, so that the processing target substrate 10 after being processed can be maintained clean.

The processing station 200 is equipped with a transfer device 280 configured to be moved between the carry-in/out station 100 and the thinning apparatus 270 while holding the processing target substrate 10 thereon and to transfer the processing target substrate 10 to/from the carry-in/out station 100 and the thinning apparatus 270. The processing target substrate 10 may be delivered to the transfer device 280 from the carry-in/out station 100, or delivered to the carry-in/out station 100 from the transfer device 280. Further, the processing target substrate 10 may be delivered to the transfer device 280 from the thinning apparatus 270, or delivered to the thinning apparatus 270 from the transfer device 280.

The transfer device 280 may transfer the processing target substrate 10 after being subjected to the laser processing, or transfer the processing target substrates 10 before being subjected to the laser processing. While the transfer device 280 is transferring the processing target substrate 10 at the outside of the laser processing apparatus 230, the laser processing apparatus 230 is capable of performing a laser processing of another processing target substrate 10. Therefore, a throughput can be improved. The transfer device 280 may also transfer the support substrate 20. Furthermore, the transfer device 280 may also transfer the combined substrate 30.

The transfer device 280 is equipped with a transfer arm 283 configured to be moved along a guide rail 282 which is provided in a transfer section 281 adjacent to the laser processing apparatus 230 in the horizontal direction. The laser processing apparatus 230, the thinning apparatus 270 and the transfer section 120 of the carry-in/out station 100 are adjacent to the transfer section 281. The laser processing apparatus 230 is disposed at a positive Y-axis side of the transfer section 281. The thinning apparatus 270 is disposed at a positive X-axis side of the transfer section 281. The transfer section 120 of the carry-in/out station 100 is disposed at a negative X-axis side of the transfer section 281.

The guide rail 282 is elongated in the X-axis direction. The transfer arm 283 is configured to be moved in the Y-axis direction, the Z-axis direction and the 0 direction as well as in the X-axis direction. For the sake of cost cutting, the transfer arm 283 is formed to have a bifurcated shape, the same as the first holding mechanism 123.

The transfer arm 283 is also capable of transferring the processing target substrate 10 to the laser processing apparatus 230 as well as to the carry-in/out station 100 and the thinning apparatus 270. The transfer arm 283 is also capable of delivering the support substrate 20 to the laser processing apparatus 230. Further, the transfer arm 283 is also capable of transferring the combined substrate 30 to the laser processing apparatus 230.

The coating apparatus 210 and the bonding apparatus 220 are adjacent to the transfer section 281. By way of example, the coating apparatus 210 and the bonding apparatus 220 are disposed at a negative Y-axis side of the transfer section 281. The transfer device 280 delivers the support substrate 20 (or the processing target substrate 10) to the coating apparatus 210. Further, the transfer device 280 transfers the processing target substrate 10 and the support substrate 20 to the bonding apparatus 220. By increasing a work amount of the transfer device 280, an operating rate of the transfer device 280 can be improved.

The substrate processing system 1 is equipped with the control device 400 configured to control an operation of the carry-in/out station 100 and an operation of the processing station 200. The control device 400 is, by way of non-limiting example, a computer, and includes a CPU (Central Processing Unit) 401, a recording medium 402 such as a memory, an input interface 403, and an output interface 404. The control device 400 allows the CPU 401 to execute a program stored in the recording medium 402, thus implementing various kinds of controls. Further, the control device 400 receives a signal from an outside through the input interface 403 and transmits a signal to the outside through the output interface 404.

The program of the control device 400 is recorded in an information recording medium and installed from the information recording medium. The information recording medium may be, by way of non-limiting example, a hard disc (HD), a flexible disc (FD), a compact disc (CD), a magneto optical disc (MO), or a memory card. Further, the program may be installed by being downloaded from a server through Internet.

Figure 9:
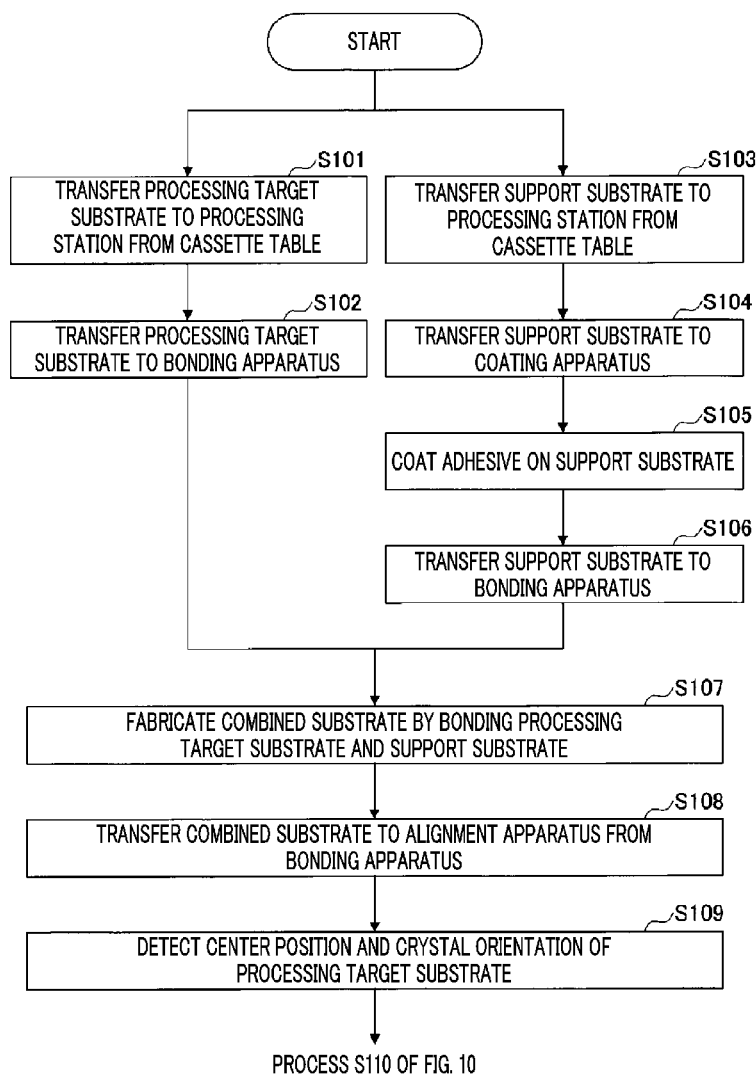
FIG. 9 is a flowchart illustrating a substrate processing method according to the exemplary embodiment.
Figure 10:
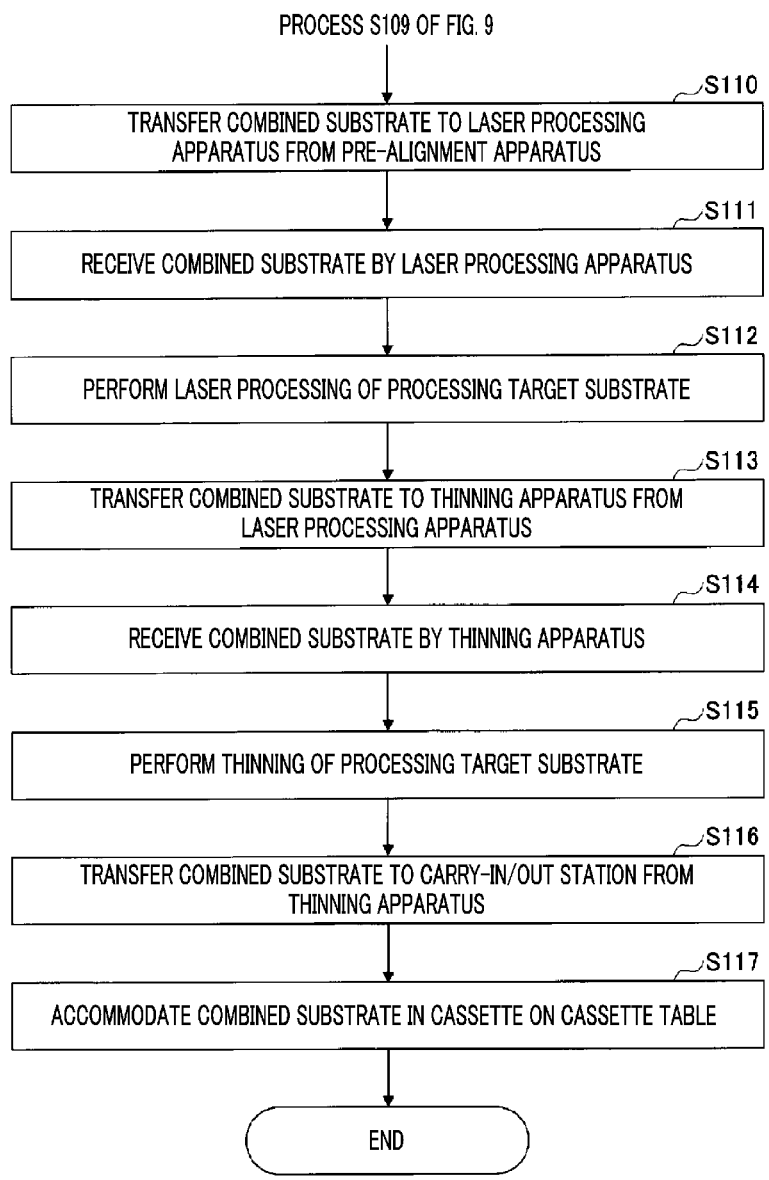
FIG. 10 is a flowchart illustrating an example of a process performed after a process S109 of FIG. 9 when thinning of the processing target substrate is performed after a laser processing of the processing target substrate.

FIG. 9 is a flowchart illustrating a substrate processing method according to the exemplary embodiment. FIG. 10 is a flowchart illustrating an example of a process performed after a process S109 of FIG. 9 when thinning of the processing target substrate is performed after a laser processing of the processing target substrate. Multiple processes shown in FIG. 9 and FIG. 10 are performed under the control of the control device 400. Further, a sequence of the multiple processes shown in FIG. 9 and FIG. 10 is not particularly limited. Furthermore, some of the multiple processes shown in FIG. 9 and FIG. 10 may be omitted.

The substrate processing method includes a process S101 in which the first holding mechanism 123 takes out the processing target substrate 10 from the cassette 101 placed on the cassette table 110 and transfers the taken processing target substrate 10 to the processing station 200. The substrate processing method includes a process S102 in which the transfer arm 283 receives the processing target substrate 10 from the first holding mechanism 123 and transfers the received processing target substrate 10 to the bonding apparatus 220. In parallel with these processes S101 and S102, following processes S103 to S106 are performed. Further, the following processes S103 to S106 need to be completed by the time when a following process S107 is begun, and may not be performed in parallel with the above-described processes S101 and S102.

The substrate processing method includes the process S103 in which the first holding mechanism 123 takes out the support substrate 20 from the cassette 102 placed on the cassette table 110 and transfers the taken support substrate 20 to the processing station 200. The substrate processing method includes the process S104 in which the transfer arm 283 receives the support substrate 20 from the first holding mechanism 123 and transfers the received support substrate 20 to the coating apparatus 210. The substrate processing method includes the process S105 in which the coating apparatus 210 coats the adhesive 22 on the bonding surface 21 of the support substrate 20 to be bonded with the processing target substrate 10. The substrate processing method includes the process S106 in which the transfer arm 283 receives the support substrate 20 from the coating apparatus 210 and transfers the received support substrate 20 to the bonding apparatus 220.

Further, in the process S102, the transfer arm 283 may transfer the processing target substrate 10 to the coating apparatus 210. In this case, in the process S104, the transfer arm 283 transfers the support substrate 20 to the bonding apparatus 220. In this case, the substrate processing method includes, instead of the process S105, a process in which the coating apparatus 210 coats the adhesive 22 on the bonding surface of the processing target substrate 10 to be bonded with the support substrate 20. Furthermore, in this case, the substrate processing method includes, instead of the process S106, a process in which the transfer arm 283 receives the processing target substrate 10 from the coating apparatus 210 and transfers the received processing target substrate 10 to the bonding apparatus 220.

The substrate processing method includes the process S107 in which the bonding apparatus 220 obtains the combined substrate 30 by bonding the support substrate 20 and the processing target substrate 10 with the adhesive 22 therebetween. In following processes S108 to S117 after the process S107, the processing target substrate 10 is maintained bonded to and reinforced by the support substrate 20. Thus, the damage of the processing target substrate 10 can be suppressed.

The substrate processing method includes the process S108 in which the transfer arm 283 receives the combined substrate 30 from the bonding apparatus 220 and transfers the received combined substrate 30 to the pre-alignment apparatus 240. The pre-alignment apparatus 240 receives the combined substrate 30 from the transfer arm 283, and holds the received combined substrate 30 by the pre-alignment stage 241.

The substrate processing method includes the process S109 in which the pre-alignment stage 241 holds the combined substrate 30 and the detector 242 detects the center position and the crystal orientation of the processing target substrate 10 held by the pre-alignment stage 241.

The substrate processing method includes the process S110 in which the transfer arm 260 receives the combined substrate 30 from the pre-alignment apparatus 240 and transfers the received combined substrate 30 to the laser processing apparatus 230.

The substrate processing method includes the process S111 in which the laser processing apparatus 230 receives the combined substrate 30 from the transfer arm 260 and holds the received combined substrate 30 by the laser processing stage 231.

The pre-alignment apparatus 240 rotates the combined substrate 30 before the process S110 and after the process S109 such that the crystal orientation of the processing target substrate 10 with respect to the laser processing stage 231 coincides with a preset orientation in the process S111. Further, the transfer arm 260 receives the combined substrate 30 from the pre-alignment stage 241 in the process S110 such that a center position of the laser processing stage 231 and the center position of the processing target substrate 10 are coincident with each other in the process S111.

The substrate processing method includes the process S112 in which the laser processing apparatus 230 performs the laser processing of the processing target substrate 10. In the process S112, the laser processing stage 231 holds the combined substrate 30, and the laser processing head 232 radiates and concentrates the laser beam LB for processing the processing target substrate 10 to the processing target substrate 10 held by the laser processing stage 231.

The substrate processing method includes the process S113 in which the transfer arm 283 receives the combined substrate 30 from the laser processing apparatus 230 and transfers the received combined substrate 30 to the thinning apparatus 270.

The substrate processing method includes the process S114 in which the thinning apparatus 270 receives the combined substrate 30 and holds the received combined substrate 30 by the rotary chuck 272.

The substrate processing method includes the process S115 in which the thinning apparatus 270 thins the processing target substrate 10. In the process S115, the rotary chuck 272 holds the combined substrate 30, and by lowering the rotary whetstone 274 into contact with the processing target substrate 10 while rotating the rotary whetstone 274, the processing target substrate 10 which is rotated along with the rotary chuck 272 is ground.

The substrate processing method includes the process S116 in which the transfer arm 283 receives the combined substrate 30 from the thinning apparatus 270 and transfers the received combined substrate 30 to the carry-in/out station 100.

The substrate processing method includes the process S117 in which the first holding mechanism 123 receives the combined substrate 30 from the transfer arm 283 and accommodates the received combined substrate 30 in either the cassette 103 or the cassette 104 placed on the cassette table 110. Upon the completion of the process S117, the current processing is ended.

Figure 11:
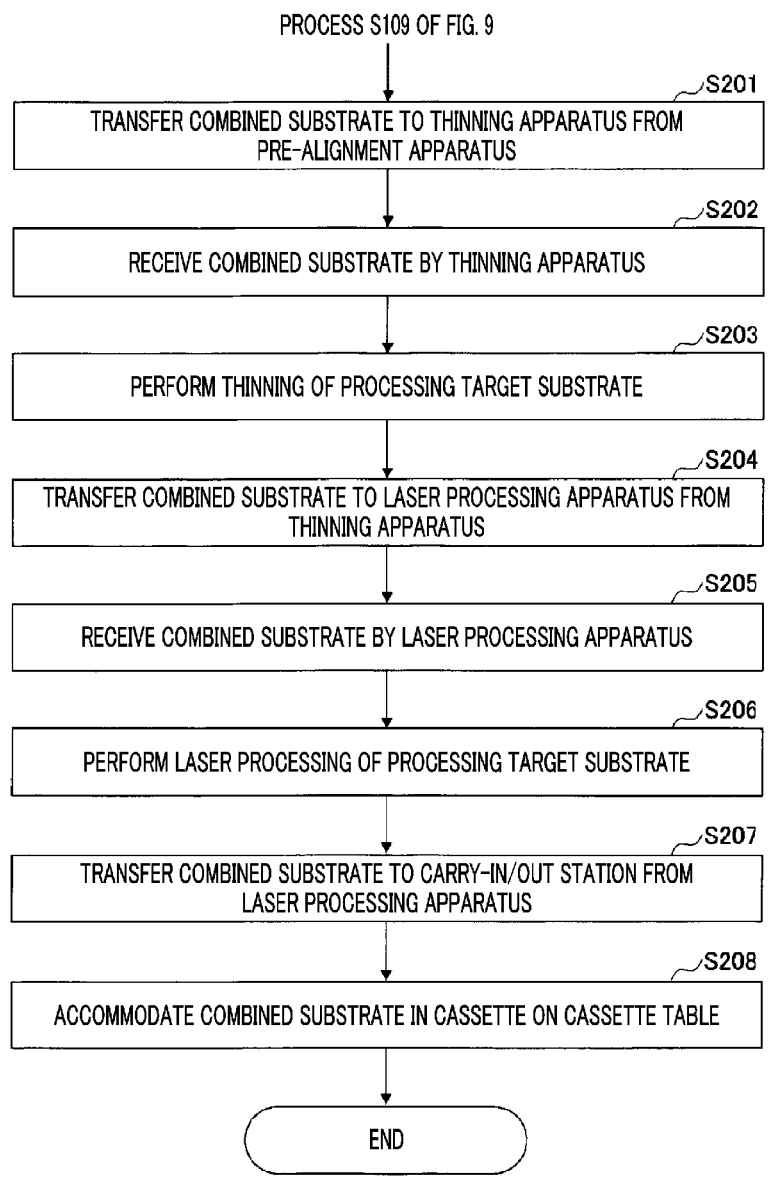
FIG. 11 is a flowchart illustrating an example of a process performed after the process S109 of FIG. 9 when the laser processing of the processing target substrate is performed after the thinning of the processing target substrate.

FIG. 11 is a flowchart illustrating an example of a process performed after the process S109 of FIG. 9 when the laser processing of the processing target substrate is performed after the thinning of the processing target substrate. Multiple processes shown in FIG. 11 are performed under the control of the control device 400. Further, a sequence of the multiple processes shown in FIG. 11 is not particularly limited. Furthermore, some of the multiple processes shown in FIG. 11 may be omitted.

The substrate processing method includes a process S201 in which the transfer arm 283 receives the combined substrate 30 from the pre-alignment apparatus 240 and transfers the received combined substrate 30 to the thinning apparatus 270.

The substrate processing method includes a process S202 in which the thinning apparatus 270 receives the combined substrate 30 and holds the received combined substrate 30 by the rotary chuck 272.

The pre-alignment apparatus 240 rotates the combined substrate 30 before the process S201 and after the process S109 such that the crystal orientation of the processing target substrate 10 with respect to the rotary chuck 272 coincides with the preset orientation in the process S202. Further, the transfer arm 283 receives the combined substrate 30 from the pre-alignment stage 241 in the process S201 such that a center position of the rotary chuck 272 and the center position of the processing target substrate 10 are coincident with each other in the process S202.

The substrate processing method includes a process S203 in which the thinning apparatus 270 thins the processing target substrate 10. In the process S203, the rotary chuck 272 holds the combined substrate 30, and the rotary whetstone 274 is lowered into contact with the processing target substrate 10 while being rotated, so that the processing target substrate 10 which is rotated along with the rotary chuck 272 is ground.

The substrate processing method includes a process S204 in which the transfer arm 283 receives the combined substrate 30 from the thinning apparatus 270 and transfers the received combined substrate 30 to the laser processing apparatus 230.

The substrate processing method includes a process S205 in which the laser processing apparatus 230 receives the combined substrate 30 from the transfer arm 283 and holds the received combined substrate 30 by the laser processing stage 231.

The substrate processing method includes a process S206 in which the laser processing apparatus 230 performs the laser processing of the processing target substrate 10. In the process S206, the laser processing stage 231 holds the combined substrate 30, and the laser processing head 232 radiates and concentrates the laser beam LB for processing the processing target substrate 10 to the processing target substrate 10 held by the laser processing stage 231.

The substrate processing method includes a process S207 in which the transfer arm 283 receives the combined substrate 30 from the laser processing apparatus 230 and transfers the received combined substrate 30 to the carry-in/out station 100.

The substrate processing method includes a process S208 in which the first holding mechanism 123 receives the combined substrate 30 from the transfer arm 283 and accommodates the received combined substrate 30 in the cassette 103 or the cassette 104 placed on the cassette table 110. Upon the completion of the process S208, the current processing is ended.

Instead of the above-described processes S207 and S208, there may be performed a process in which the transfer device 122 of the carry-in/out station 100 receives the combined substrate 30 from the laser processing apparatus 230 and accommodates the received combined substrate 30 in the cassette 103 or 104 placed on the cassette table 110.

So far, the exemplary embodiment of the substrate processing system and the substrate processing method has been described. However, it should be noted that the present disclosure is not limited to the above-described exemplary embodiment. Various changes, modifications, replacements, addition, deletion and combinations may be made within the scope of the claims, and all of these are included in the scope of the inventive concept of the present disclosure.

Though the substrate processing system 1 according to the above-described exemplary embodiment has the coating apparatus 210 and the bonding apparatus 220, it may not include the coating apparatus 210 and the bonding apparatus 220. In such a case, in the description of FIG. 9 to FIG. 11, the combined substrate 30 is replaced with the processing target substrate 10. Further, in this case, instead of the processes S101 to S108 in FIG. 9, there is performed a process in which the transfer device 122 of the carry-in/out station 100 takes out the processing target substrate 10 from the cassette 101 placed on the cassette table 110 and transfers the taken processing target substrate 10 to the pre-alignment apparatus 240.

The substrate processing system 1 according to the above-described exemplary embodiment is configured to be capable of coping with any of two cases: where the laser processing of the processing target substrate 10 is performed before the thinning of the processing target substrate 10 and where the thinning of the processing target substrate 10 is performed before the laser processing. However, the substrate processing system 1 may be configured to be capable of coping with either one of these cases. By way of example, when the substrate processing system 1 is adapted to correspond to only the case where the thinning of the processing target substrate 10 is first performed, the substrate processing system 1 may not have the transfer arm 260.

The substrate processing system 1 according to the above-described exemplary embodiment is configured to perform both the laser processing of the processing target substrate 10 and the thinning of the processing target substrate 10. However, the substrate processing system 1 may be configured to perform only the laser processing of the processing target substrate 10 and may not have the thinning apparatus 270. In this case, upon the completion of the process S112 of FIG. 10, the processing target substrate 10 is accommodated in the cassette placed on the cassette table 110 after being transferred through the transfer section 120. Then, the current processing is ended.

The present application claims priority to Japanese Patent Application No. 2018-086913, field on Apr. 27, 2018, which application is hereby incorporated by reference in their entirety.

EXPLANATION OF CODES

According to the exemplary embodiments, it is possible to reduce an installation area of a substrate processing system configured to perform a laser processing of a substrate.

We claim:
1. A substrate processing system, comprising:
a carry-in/out station in which a cassette accommodating therein a processing target substrate is carried in or out;
a pre-alignment apparatus disposed within a processing station and comprising a pre-alignment stage configured to hold the processing target substrate and a detector configured to detect a center position and a crystal orientation of the processing target substrate held by the pre-alignment stage; and
a laser processing apparatus disposed within the processing station and comprising a laser processing stage configured to hold the processing target substrate and a laser processing head configured to radiate and concentrate a laser beam for processing the processing target substrate to the processing target substrate held by the laser processing stage,
wherein the pre-alignment apparatus is disposed above the laser processing apparatus within the same processing station.

2. The substrate processing system of claim 1, further comprising:
a whetstone configured to thin the processing target substrate, wherein the whetstone and the carry-in/out station are disposed at opposite sides from each other with the laser processing apparatus therebetween in a horizontal direction.

3. The substrate processing system of claim 2, further comprising:
a transfer arm configured to be moved along a guide rail between the carry-in/out station and the whetstone while holding the processing target substrate, and deliver the processing target substrate to the carry-in/out station and the whetstone.

4. The substrate processing apparatus of claim 3, wherein the guide rail is provided in a transfer section adjacent to the laser processing apparatus in the horizontal direction.

5. The substrate processing apparatus of claim 4, further comprising:
- a coating nozzle configured to coat an adhesive on a bonding surface of a support substrate to be bonded with the processing target substrate or on a bonding surface of the processing target substrate to be bonded with the support substrate; and
- a lower chuck and an upper chuck which are configured to bond the support substrate hold by the lower chuck and the processing target substrate hold by the upper chuck with the adhesive therebetween,
- wherein the coating nozzle and the lower and upper chucks are disposed adjacent to the transfer section.

6. The substrate processing apparatus of claim 4, further comprising:
- a control device and a storage including a computer program, wherein the storage and the computer program are configured, with the control device, to control a transfer of the processing target substrate from the pre-alignment apparatus to the whetstone by the transfer arm.

7. The substrate processing apparatus of claim 1, further comprising:
- a moving mechanism configured to move the laser processing stage;
- a transfer arm disposed inside the laser processing apparatus when viewed from a vertical direction, and configured to transfer the processing target substrate from the pre-alignment apparatus to the laser processing apparatus,
- wherein the transfer arm is configured to movable vertically above the moving mechanism.

8. The substrate processing apparatus of claim 1,
- wherein when viewed from a vertical direction, the pre-alignment apparatus is disposed inside an edge of the laser processing apparatus so as not to be protruded from the laser processing apparatus.

9. A substrate processing method of processing a processing target substrate by using a substrate processing system as claimed in claim 1, the substrate processing method comprising:
- holding the processing target substrate by the pre-alignment stage and detecting, by the detector, the center position and the crystal orientation of the processing target substrate held by the pre-alignment stage; and
- holding the processing target substrate by the laser processing stage and radiating and concentrating, by the laser processing head, the laser beam for processing the processing target substrate to the processing target substrate held by the laser processing stage.

10. The substrate processing method of claim 9, further comprising:
- thinning the processing target substrate by a whetstone which is disposed at an opposite side from a carry-in/out station with the laser processing apparatus therebetween in a horizontal direction, the cassette accommodating therein the processing target substrate being carried in or out in the carry-in/out station.

11. The substrate processing method of claim 10, further comprising:
- transferring the processing target substrate to the carry-in/out station and the whetstone by a transfer arm configured to be moved between the carry-in/out station and the whetstone while holding the processing target substrate.

12. The substrate processing method of claim 11,
- wherein the transfer arm is configured to be moved along a guide rail which is provided in a transfer section adjacent to the laser processing apparatus in the horizontal direction,
- wherein the substrate processing method comprises:
- transferring, by the transfer arm, the processing target substrate to the carry-in/out station and the whetstone.

13. The substrate processing method of claim 12, further comprising:
- coating, by a coating nozzle disposed adjacent to the transfer section in the horizontal direction, an adhesive on a bonding surface of a support substrate to be bonded with the processing target substrate or on a bonding surface of the processing target substrate to be bonded with the support substrate; and
- bonding, by a lower chuck and an upper chuck disposed adjacent to the transfer section in the horizontal direction, the support substrate and the processing target substrate with the adhesive therebetween.

14. The substrate processing method of claim 12, further comprising:
- transferring, by the transfer arm, the processing target substrate to the whetstone from the pre-alignment apparatus.

15. The substrate processing method of claim 9, further comprising:
- transferring, by a transfer arm provided inside the laser processing apparatus when viewed from a vertical direction, the processing target substrate to the laser processing apparatus from the pre-alignment apparatus.

* * * * *